United States Patent
Matsuura

(10) Patent No.: US 7,979,037 B2
(45) Date of Patent: Jul. 12, 2011

(54) FREQUENCY MODULATION CIRCUIT, TRANSMISSION CIRCUIT, AND COMMUNICATION APPARATUS

(75) Inventor: Toru Matsuura, Osaka (JP)

(73) Assignee: Panasonic Corporation, Osaka (JP)

( * ) Notice: Subject to any disclaimer, the term of this patent is extended or adjusted under 35 U.S.C. 154(b) by 733 days.

(21) Appl. No.: 11/878,286

(22) Filed: Jul. 23, 2007

(65) Prior Publication Data
US 2008/0032649 A1 Feb. 7, 2008

(30) Foreign Application Priority Data
Jul. 28, 2006 (JP) .............................. 2006-206247

(51) Int. Cl.
*H04B 1/04* (2006.01)
(52) U.S. Cl. ....... 455/110; 455/78; 455/106; 455/114.3; 455/115.1; 455/126
(58) Field of Classification Search .................. 455/106, 455/110, 113, 114.1–114.3, 115.1, 126; 332/123, 332/126, 127, 128
See application file for complete search history.

(56) References Cited

U.S. PATENT DOCUMENTS

| | | | | |
|---|---|---|---|---|
| 4,755,774 A * | 7/1988 | Heck | ............................ | 332/123 |
| 4,940,977 A * | 7/1990 | Mandell | ....................... | 341/143 |
| 5,079,521 A * | 1/1992 | Gaskell et al. | ................ | 331/1 A |
| 5,093,637 A | 3/1992 | Isota et al. | | |
| 5,341,136 A * | 8/1994 | Przybysz et al. | .............. | 341/133 |
| 5,396,484 A | 3/1995 | Itoh | | |
| 5,751,705 A | 5/1998 | Sato | | |
| 6,360,283 B1 * | 3/2002 | Houldsworth | .................... | 710/3 |
| 6,717,998 B2 | 4/2004 | Adachi et al. | | |
| 7,010,280 B1 | 3/2006 | Wilson | | |
| 7,034,728 B2 * | 4/2006 | Luh et al. | ....................... | 341/143 |
| 7,075,383 B2 * | 7/2006 | Adachi et al. | ................. | 332/127 |
| 7,092,683 B2 | 8/2006 | Tanaka et al. | | |
| 7,469,137 B2 * | 12/2008 | Jensen | ........................... | 455/333 |
| 7,522,011 B2 * | 4/2009 | Matero et al. | ................. | 332/128 |
| 2004/0037369 A1 | 2/2004 | Matsuura et al. | | |
| 2005/0008093 A1 | 1/2005 | Matsuura et al. | | |

OTHER PUBLICATIONS

Wendell B. Sander, et al., "Polar Modulator for Multi-mode Cell Phones", US, Tropian, Inc.

* cited by examiner

*Primary Examiner* — Edward Urban
*Assistant Examiner* — Ganiyu Hanidu
(74) *Attorney, Agent, or Firm* — Wenderoth, Lind & Ponack, L.L.P.

(57) ABSTRACT

A bandpass type delta sigma modulation section performs delta sigma modulation on an inputted modulation signal such that quantization noise is reduced in a frequency band which requires low noise. A low pass filter removes a noise component in a high frequency region from the signal on which the delta sigma modulation has been performed. A frequency modulation circuit reduces noise in the frequency band which requires low noise with the bandpass type delta sigma modulation section and the low pass filter, and reduces noise in the vicinity of a direct current component DC with a feedback comparison section and a loop filter.

10 Claims, 12 Drawing Sheets

F I G. 1 3 PRIOR ART
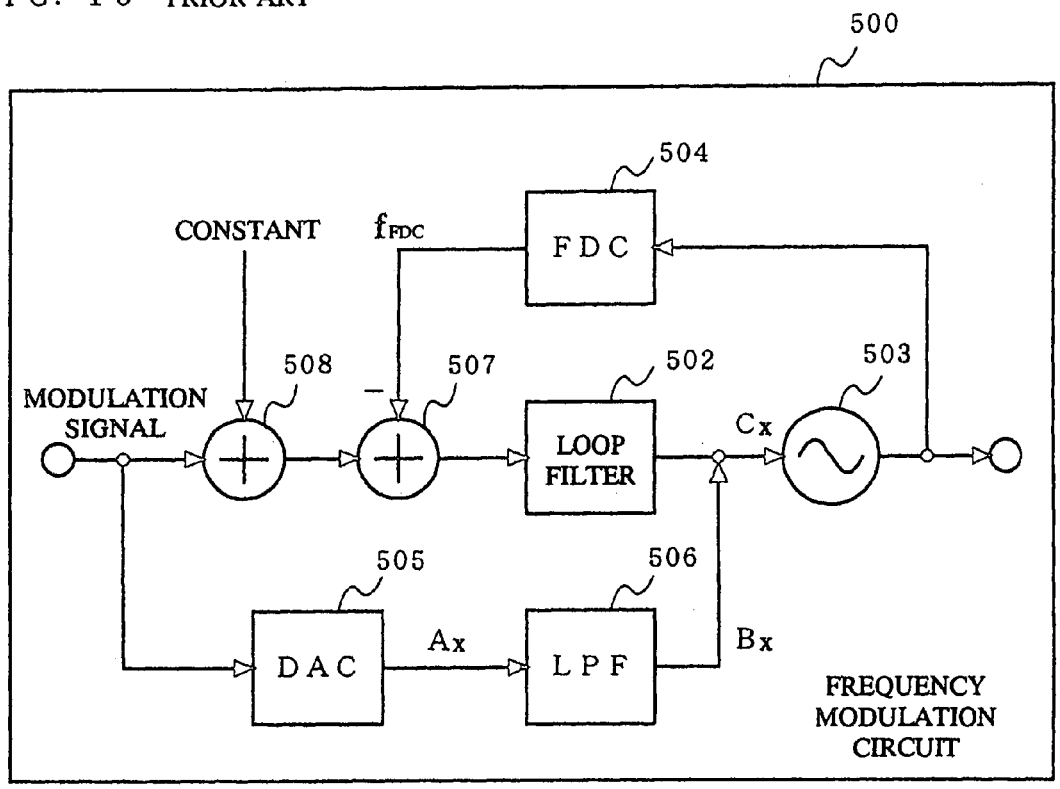
F I G. 1 3 PRIOR ART
F I G. 1 4 PRIOR ART
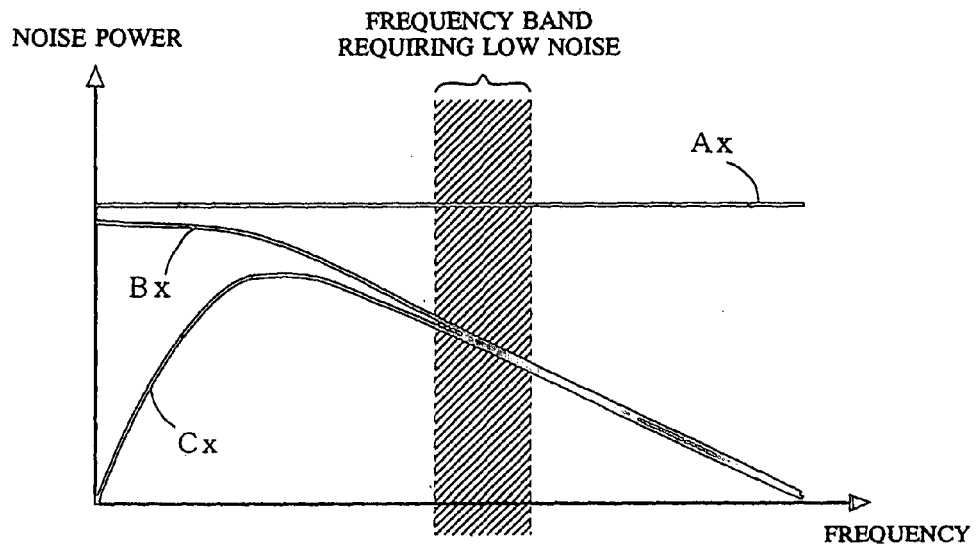

FREQUENCY MODULATION CIRCUIT, TRANSMISSION CIRCUIT, AND COMMUNICATION APPARATUS

BACKGROUND OF THE INVENTION

1. Field of the Invention

The present invention relates to a frequency modulation circuit which is used in communication apparatuses such as mobile phones, wireless LAN devices, or the like, a transmission circuit, and a communication apparatus. More particularly, the present invention relates to a frequency modulation circuit which reduces noise present in a desired frequency band and operates with low distortion and high efficiency, a transmission circuit using the frequency modulation circuit, and a communication apparatus.

2. Description of the Background Art

Communication apparatuses such as mobile phones, wireless LAN devices, or the like need to operate with low power consumption while maintaining the accuracy of an output signal. Such communication apparatuses require a frequency modulation circuit which outputs a frequency modulation signal having low distortion and operates with high efficiency and a transmission circuit using the frequency modulation circuit. The following will describe a conventional frequency modulation circuit.

As an example of a conventional frequency modulation circuit, there exists a frequency modulation circuit which is disclosed in Wendell B. Sander, et al, "Polar Modulator for Multi-mode Cell Phones", US, Tropian, Inc. FIG. 13 is a block diagram showing an exemplarily configuration of a conventional frequency modulation circuit 500. As shown in FIG. 13, the conventional frequency modulation circuit 500 includes first and second arithmetic units 507 and 508, a loop filter 502, a voltage controlled oscillator (VCO) 503, a frequency digital converter (FDC) 504, a DA converter (DAC) 505, and a low pass filter (LPF) 506.

A modulation signal is inputted to the conventional frequency modulation circuit 500 through an input terminal. The modulation signal is inputted to the VCO 503 through the first arithmetic unit 507, the second arithmetic unit 508 and the loop filter 502. The modulation signal is also inputted to the VCO 503 through the DAC 505 and the LPF 506. The VCO 503 frequency-modulates the modulation signal by controlling an oscillatory frequency according to the inputted modulation signal, and outputs a resultant signal as a frequency modulation signal.

The second arithmetic unit 508 adds or subtracts a constant to or from the inputted modulation signal to control the center frequency of the modulation signal. FDC 504 converts the frequency of the frequency modulation signal outputted by the VCO 503 into a digital value, and outputs the converted digital value to the first arithmetic unit 507. The first arithmetic unit 507 adds the digital value outputted by the FDC 504 to the modulation signal outputted by the second arithmetic unit 508, and outputs a resultant signal to the loop filter 502. The loop filter 502 suppresses the high-frequency component of the modulation signal outputted by the first arithmetic unit 507. In other words, the FDC 504, the first arithmetic unit 507, and the loop filter 502 constitute a feedback loop which stabilizes the frequency of the frequency modulation signal outputted by the VCO 503.

Meanwhile, the DAC 505 converts the inputted modulation signal into an analog signal. The LPF 506 serves to suppress noise such as quantization noise which is generated with the processing by the DAC 505.

FIG. 14 illustrates a problem of the conventional frequency modulation circuit 500. FIG. 14 shows a relationship between noise and a frequency which are included in each of an output signal Ax of the DAC 505, an output signal Bx of the LPF 506 when the LPF 506 is not connected to an input of the VCO 503, and an input signal Cx to VCO 503 when the LPF 506 is connected to the input of the VCO 503. It is noted that the symbols Ax to Cx in FIG. 14 correspond to the points Ax to Cx in FIG. 13, respectively.

As shown in FIG. 14, the output signal Ax of the DAC 505 includes substantially uniform quantization noise and the like. The LPF 506 removes noise of a high frequency region from the output signal Ax of the DAC 505. Since the LPF 506 is connected to the input of the VCO 503, the output signal Bx of the LPF 506 is inputted as the input signal Cx to the VCO 503 after noise in the vicinity of a direct current component DC is removed by the operation of the feedback loop of the conventional frequency modulation circuit 500.

As shown in FIG. 14, however, the noise of the input signal Cx to the VCO 503 is not always sufficiently reduced in a frequency band which requires low noise (the shaded area in FIG. 14). Therefore, the conventional frequency modulation circuit 500 has a problem that it cannot output a frequency modulation signal the noise of which is sufficiently reduced in the frequency band which requires low noise.

There is a possibility that in the case where the conventional frequency modulation circuit 500 is installed in a communication apparatus which performs transmission and reception concurrently, the noise generated at the conventional frequency modulation circuit 500 overlaps with a receiving band of the communication apparatus, and this adversely affects the receiving quality of the communication apparatus.

SUMMARY OF THE INVENTION

Therefore, an object of the present invention is to provide a frequency modulation circuit which reduces the noise present in the frequency band requiring low noise and operates with low distortion and high efficiency, a transmission circuit using the frequency modulation circuit, and a communication apparatus.

The object of the present invention is directed to a frequency modulation circuit which frequency-modulates and outputs an input signal. In order to achieve the above-mentioned object, the frequency modulation circuit of the present invention comprises a bandpass type delta sigma modulation section operable to perform delta sigma modulation on the input signal such that quantization noise is suppressed in a frequency band which requires low noise; a loop filter operable to output a signal which is the input signal a high-frequency component of which is suppressed; a voltage controlled oscillator operable to frequency-modulate the input signal by controlling a oscillatory frequency according to the signal outputted from the loop filter and the bandpass type delta sigma modulation, and output a resultant signal as a frequency modulation signal; and a feedback comparison section operable to compare the frequency modulation signal which is fed back from the voltage controlled oscillator with the input signal, control a frequency of the input signal according to the result of the comparison, and output the frequency-controlled input signal to the loop filter.

It is noted that the frequency modulation circuit may comprise a compensating filter operable to filter and output the input signal to the bandpass type delta sigma modulation section to compensate output characteristics of the bandpass type delta sigma modulation section.

Preferably, the feedback comparison section includes a frequency digital converter operable to convert a frequency of the frequency modulation signal outputted by the voltage controlled oscillator into a digital value based on a predetermined manner; and an arithmetic section operable to add or subtract the digital value converted by the frequency digital converter to or from the input signal.

Preferably, the frequency modulation circuit may comprise a lowpass type delta sigma modulation section operable to perform delta sigma modulation with signal transfer characteristics of lowpass type on the signal outputted from the loop filter, and output to the voltage controlled oscillator the signal on which the delta sigma modulation has been performed. In this case, the frequency modulation circuit may further comprise a second arithmetic section operable to input to the arithmetic section a signal a center frequency of which is controlled by adding or subtracting a constant to or from the input signal.

The frequency modulation circuit may further comprise a lowpass type delta sigma modulation section operable to perform delta sigma modulation with signal transfer characteristics of lowpass type on the input signal, and output to the feedback comparison section the signal on which the delta sigma modulation has been performed, and the feedback comparison section may include a frequency divider operable to frequency-divide the frequency modulation signal outputted by the voltage controlled oscillator with the signal on which the delta sigma modulation has been performed by the lowpass type delta sigma modulation section; and a comparison section operable to compare a predetermined reference signal with the signal which has been frequency-divided by the frequency divider, and control the oscillatory frequency of the voltage controlled oscillator such that both of the signals are synchronized.

The present invention is directed to a transmission circuit including the above-mentioned frequency modulation circuit. The transmission circuit comprises a signal generation section operable to generate an amplitude signal and a phase signal based on an amplitude component and a phase component which are obtained by performing signal processing on input data; an amplitude amplifying section operable to output a signal which is controlled according to the amplitude signal; the frequency modulation circuit operable to frequency-modulate and output the phase signal as a frequency modulation signal, and an amplitude modulation section operable to amplitude-modulate the frequency modulation signal by using the signal outputted from the amplitude amplifying section, and output the frequency-modulated and amplitude-modulated signal as a transmission signal.

Further, the present invention is directed to a communication apparatus including the above-mentioned transmission circuit. The communication apparatus comprises the transmission circuit operable to generate a transmission signal; and an antenna operable to output the transmission signal generated by the transmission circuit. The communication apparatus may comprise a reception circuit operable to process a reception signal received from the antenna, and an antenna duplexer operable to output the transmission signal generated by the transmission circuit to the antenna, and output the reception signal received from the antenna to the reception circuit.

According to the above-mentioned present invention, noise is reduced in the frequency band which requires low noise by the bandpass type delta sigma modulation section, and noise in the vicinity of a direct current component DC are further reduced by the feedback loop. Thus, a frequency modulation signal the noise of which is reduced can be outputted in the frequency band which requires low noise.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6B illustrates an example of output characteristics of each section of the frequency modulation circuit 2 when the function of the compensating filter 21 is ON;

FIG. 13 is a diagram showing an exemplary configuration of a conventional frequency modulation circuit 500; and FIG. 14 illustrates a problem of the frequency modulation circuit 500.

DESCRIPTION OF THE PREFERRED EMBODIMENTS

First Embodiment

Figure 1:
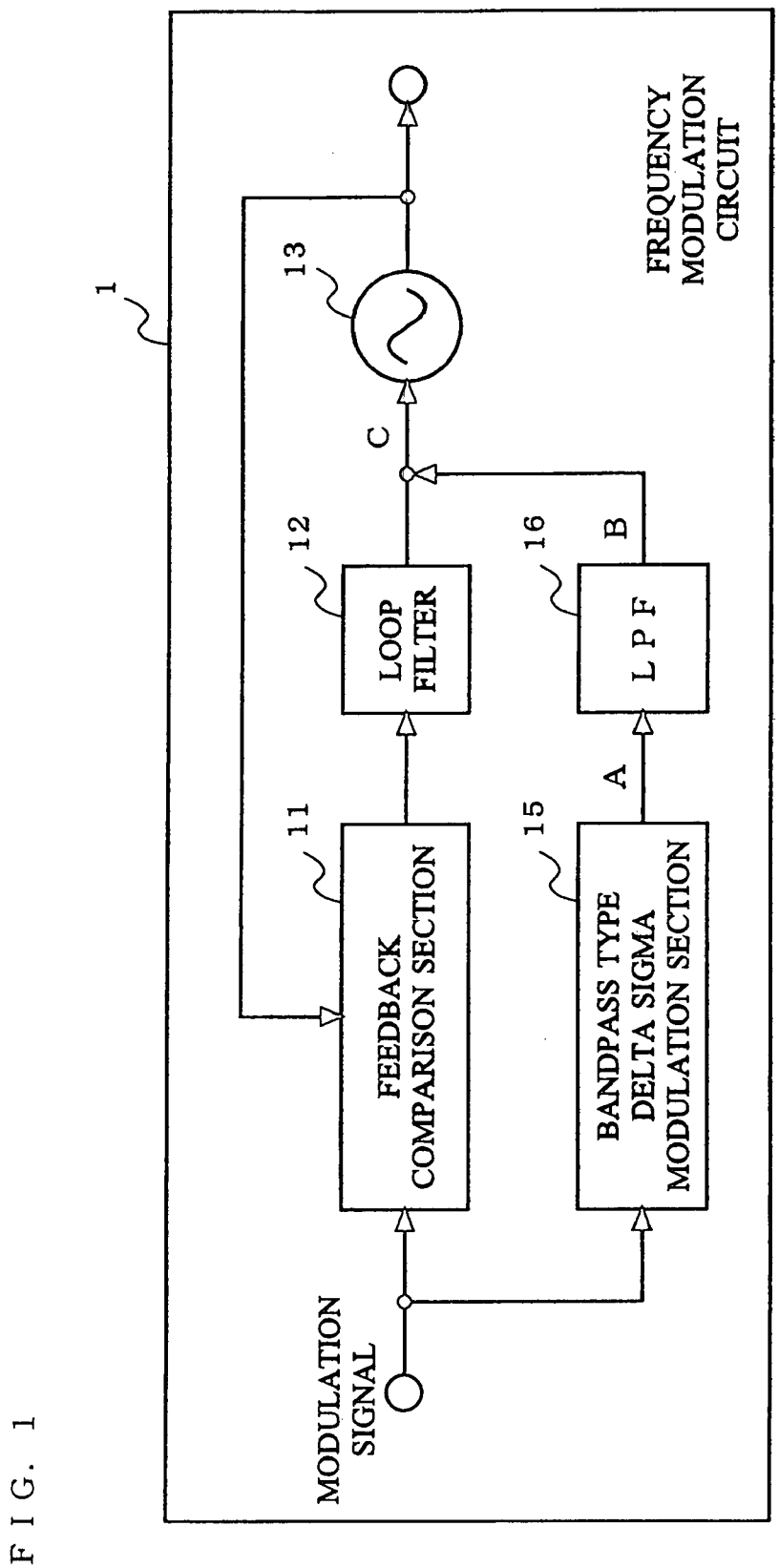
FIG. 1 is a diagram showing an exemplary configuration of a frequency modulation circuit 1 according to a first embodiment of the present invention.

FIG. 1 is a block diagram showing an exemplary configuration of a frequency modulation circuit 1 according to a first embodiment of the present invention. As shown in FIG. 1, the frequency modulation circuit 1 according to the first embodiment comprises a feedback comparison section 11, a loop filter 12, a voltage controlled oscillator (VCO) 13, a bandpass type delta sigma modulation section 15, and a low pass filter (LPF) 16.

A modulation signal is inputted to the frequency modulation circuit 1 through an input terminal. The modulation signal is inputted to the VCO 13 through the feedback comparison section 11 and the loop filter 12. The modulation signal is also inputted to the VCO 13 through the bandpass type delta sigma modulation section 15 and LPF 16. The VCO 13 frequency-modulates the modulation signal by controlling an oscillatory frequency based on the inputted modulation signal, and outputs a resultant signal as a frequency modulation signal.

The feedback comparison section 11 returns and inputs the frequency modulation signal outputted by the VCO 13. The feedback comparison section 11 compares the frequency of the inputted modulation signal with the frequency of the returned frequency modulation signal, and outputs to the loop filter 12 the modulation signal the frequency of which is controlled according to the result of the comparison. The loop filter 12 suppresses the high-frequency component of the controlled modulation signal outputted from the feedback comparison section 11. In other words, the feedback comparison section 11, the loop filter 12, and the VCO 13 constitute a feedback loop which stabilizes the frequency of the frequency modulation signal outputted by the VCO 13.

Figure 4:
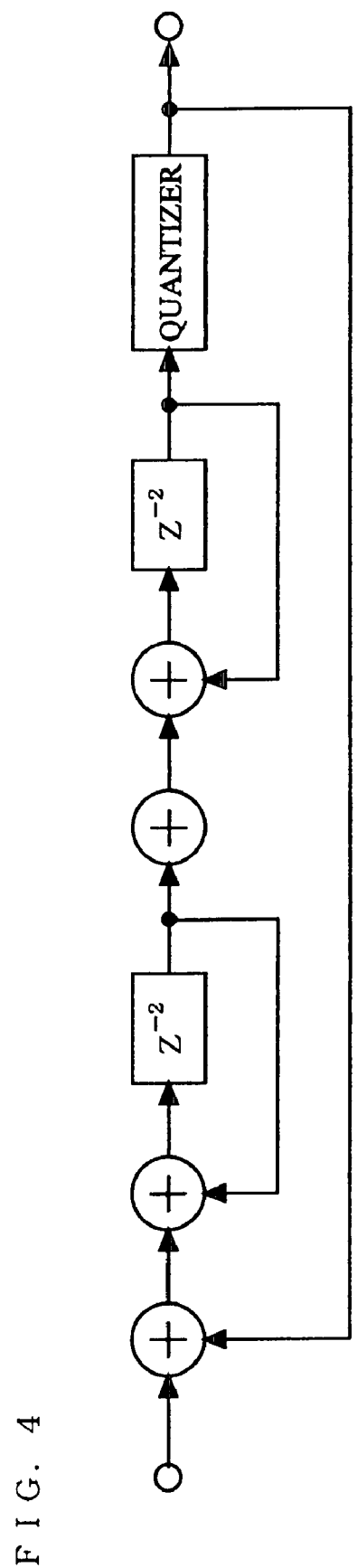
FIG. 4 is a diagram showing a detailed configuration of the bandpass type delta sigma modulation section 15.

The bandpass type delta sigma modulation section 15 performs delta sigma modulation on the inputted modulation signal, and outputs a resultant signal as a delta sigma modulation signal. A detailed configuration of the bandpass type delta sigma modulation section 15 is shown in FIG. 4. In the case of the configuration in FIG. 4, noise transfer function is "$1+2Z^{-2}+Z^{-4}$" having a zero point at $\pi/2$ and low noise at a frequency of fs/4. The LPF 16 suppresses noise such as quantization noise generated with the processing by the bandpass type delta sigma modulation section 15.

Figure 2:
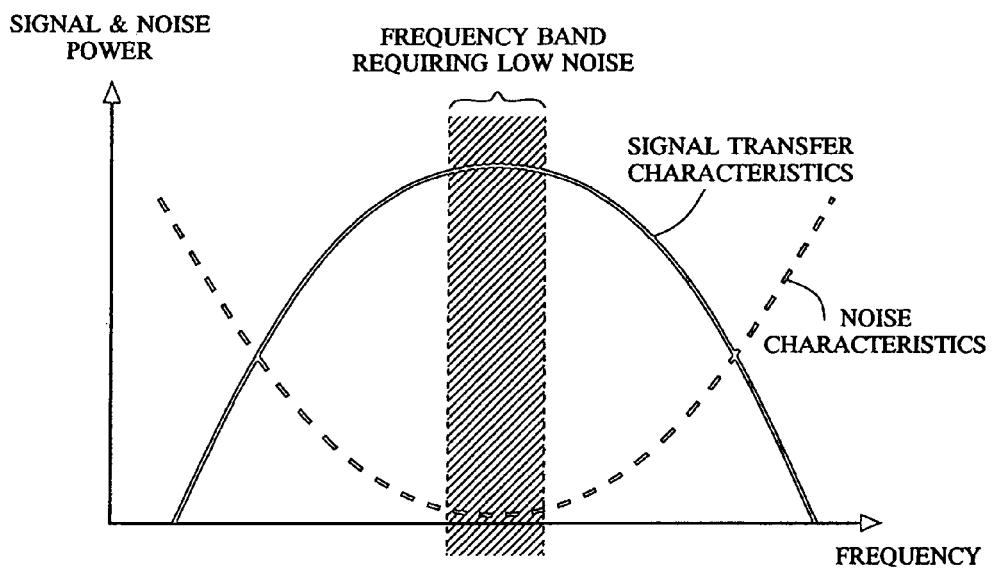
FIG. 2 illustrates characteristics of a bandpass type delta sigma modulation section 15.

FIG. 2 shows characteristics of the bandpass type delta sigma modulation section 15 in FIG. 1. As shown in FIG. 2, the bandpass type delta sigma modulation section 15 has signal transfer characteristics of bandpass type, and has noise characteristics reverse to the signal transfer characteristics due to the effect of noise shaping. Thus, the characteristics of the bandpass type delta sigma modulation section 15 is designed such that quantization noise is minimized in a frequency band (the shaded area in FIG. 2) which requires low noise by the delta sigma modulation.

Figure 3:
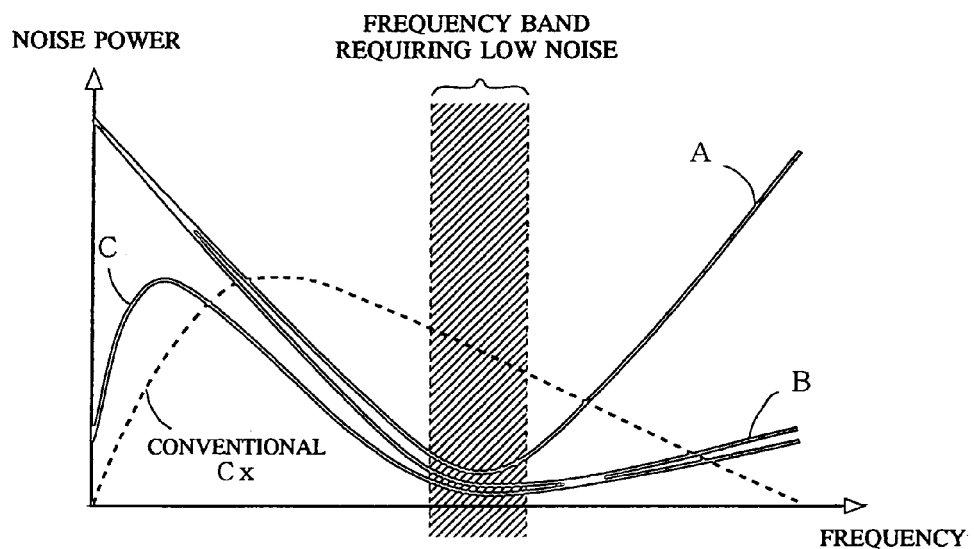
FIG. 3 illustrates the operation of the frequency modulation circuit 1 according to the first embodiment of the present invention.

FIG. 3 illustrates the operation of the frequency modulation circuit 1 according to the first embodiment of the present invention. FIG. 3 shows a relationship between noise and a frequency which are included in each of an output signal A of the bandpass type delta sigma modulation section 15, an imaginary output signal B of the LPF 16 when the output of the LPF 16 is not connected to the input of the VCO 13 (hereinafter referred to merely as the output signal B of the LPF 16), an input signal C to the VCO 13 when the output of the LPF 16 is connected to the input of the VCO 13 (hereinafter referred to merely as the output signal C to the VCO 13). It is noted that the symbols A to C in FIG. 3 correspond to the points A to C in FIG. 1, respectively.

The modulation signal inputted through the input terminal becomes the output signal A the quantization noise of which is minimized in a frequency band (the shaded area in FIG. 3) which requires low noise by the optimally-designed bandpass type delta sigma modulation section 15. The output signal A becomes the output signal B such that the noise of the output signal A in a high frequency region including at least the frequency band which requires low noise is removed by the LPF 16. The output signal B becomes the input signal C the noise of which in the vicinity of a direct current component DC is reduced by the operation of the feedback loop of the frequency modulation circuit 1, and is outputted to the VCO 13.

Therefore, the VCO 13 changes the oscillatory frequency according to the input signal C and outputs a frequency modulation signal noise of which is reduced in the frequency band which requires low noise. As seen from FIG. 3, since the conventional frequency modulation circuit 500 without the bandpass type delta sigma modulation section 15 cannot sufficiently reduce quantization noise in the frequency band which requires low noise, noise characteristics (the dotted line in FIG. 3) of the input signal Cx inputted to the VCO 13 is extremely inadequate in comparison to the present invention.

As mentioned above, according to the frequency modulation circuit 1 of the first embodiment of the present invention, the noise is reduced in the frequency band which requires low noise by the bandpass type delta sigma modulation section 15, and the noise in the vicinity of the direct current component DC is reduced by the feedback loop. Thus, the frequency modulation circuit 1 can output the frequency modulation signal the noise of which is reduced in the frequency band which requires low noise. When installed in a communication apparatus which performs transmission and reception concurrently, the frequency modulation circuit 1 reduces noise present in a band which overlaps with a receiving band of the communication apparatus, thereby preventing noise generated at the frequency modulation circuit 1 from adversely affecting the receiving quality of the communication apparatus.

Second Embodiment

Although it is ideal to design the bandpass type delta sigma modulation section 15 so as to obtain desired output characteristics as described in the above first embodiment, this design is practically difficult.

A second embodiment will describe a frequency modulation circuit which even though the bandpass type delta sigma modulation section 15 is not designed so as to obtain a desired output characteristics, makes total characteristics close to a desired value by compensating the output characteristics.

Figure 5:
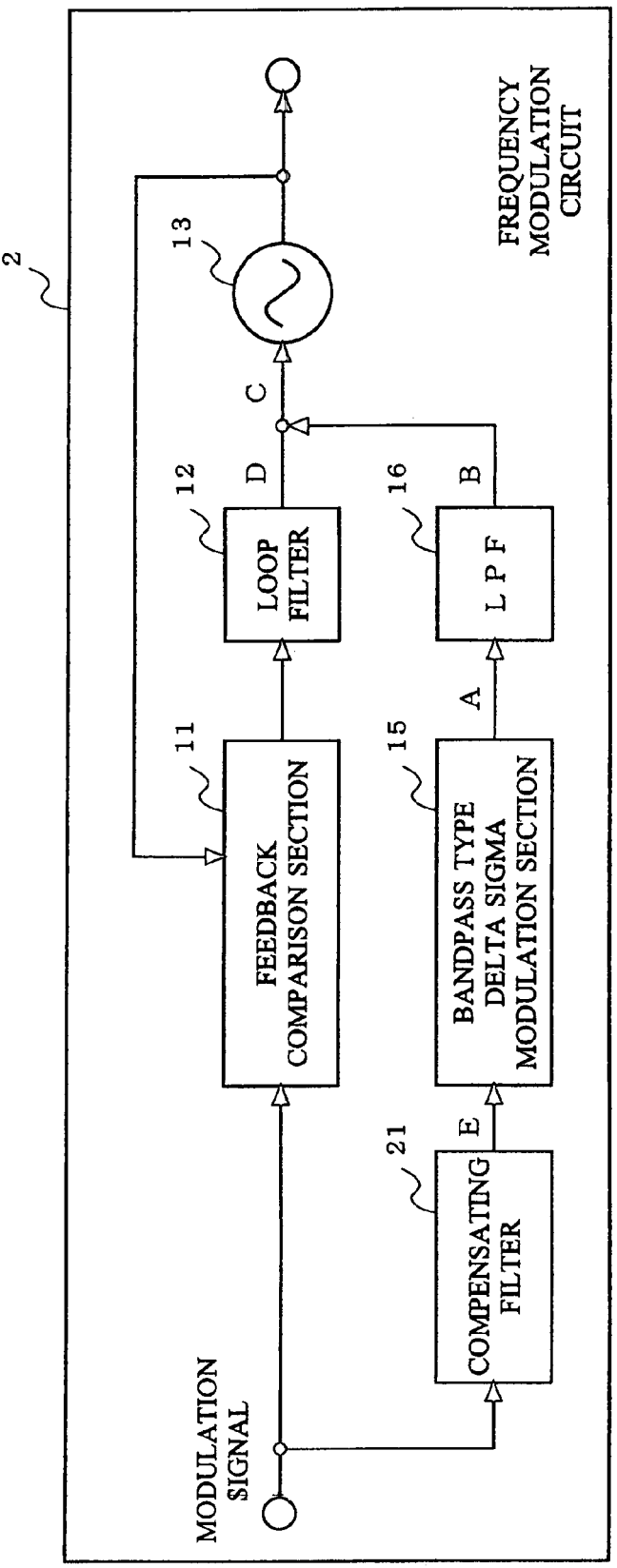
FIG. 5 is a diagram showing an exemplary configuration of a frequency modulation circuit 2 according to a second embodiment of the present invention.

FIG. 5 is a block diagram showing an exemplary configuration of a frequency modulation circuit 2 according to the second embodiment of the present invention. As shown in FIG. 5, the frequency modulation circuit 2 according to the second embodiment comprises a feedback comparison section 11, a loop filter 12, a VCO 13, a compensating filter 21, a bandpass type delta sigma modulation section 15, and a LPF 16. The frequency modulation circuit 2 differs from the frequency modulation circuit 1 according to the above-mentioned first embodiment in that the compensating filter 21 is provided in the previous stage of the bandpass type delta sigma modulation section 15. The compensating filter 21 serves to compensate the output characteristics of the bandpass type delta sigma modulation section 15. It is noted that the same components as those in the above-mentioned first embodiment are designated by the same reference numerals, and the description thereof will be omitted.

Figure 6A:
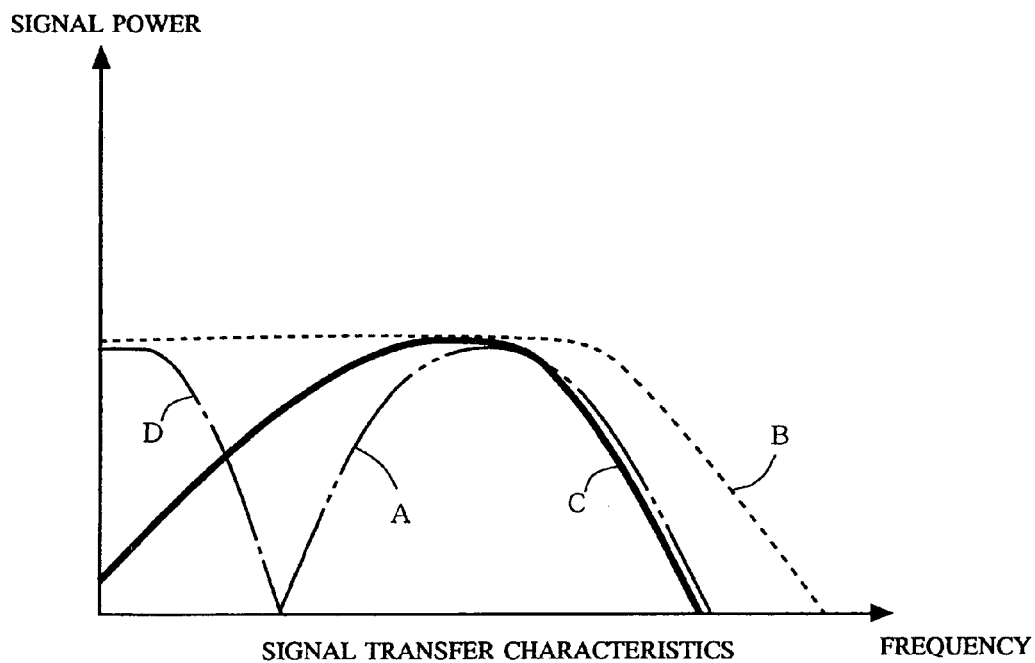
FIG. 6A illustrates an example of output characteristics of each section of the frequency modulation circuit 2 when the function of a compensating filter 21 is OFF.
Figure 6B:
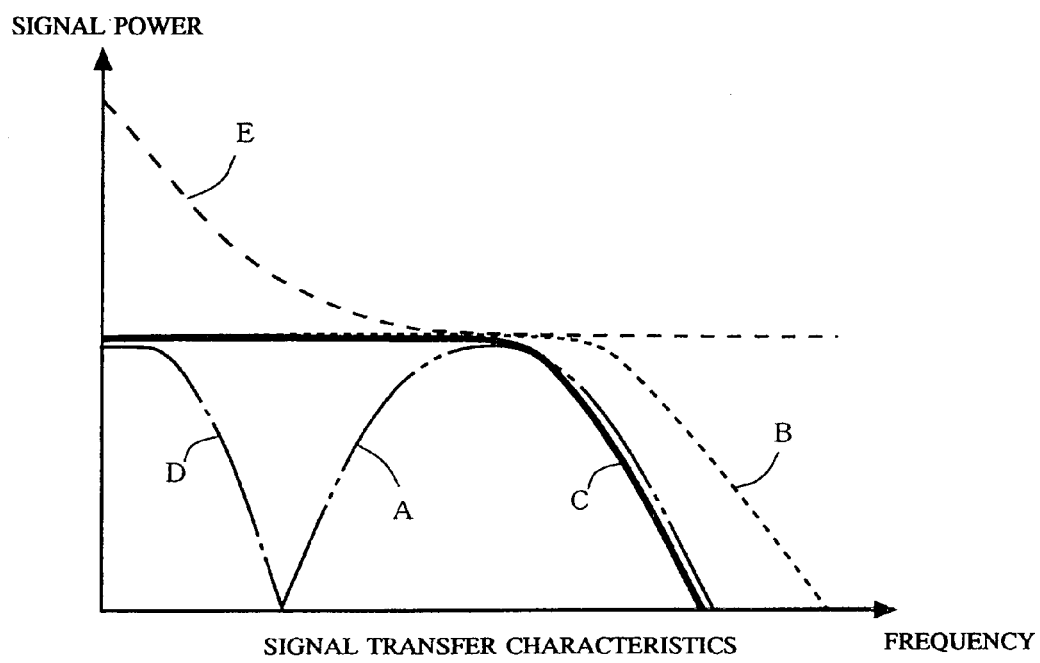

The operation of the compensating filter 21 will be described using FIGS. 6A and 6B. FIG. 6A illustrates an example of output characteristics of each section of the frequency modulation circuit 2 when the function of the compensating filter 21 is OFF. FIG. 6B illustrates an example of output characteristics of each section of the frequency modulation circuit 2 when the function of the compensating filter 21 is ON. It is noted that FIGS. 6A and 6B show a relationship between power and a frequency which are included in each of an output signal E of the compensating filter 21, an output signal A of the bandpass type delta sigma modulation section 15, an imaginary output signal B of the LPF 16 when the output of the LPF 16 is not connected to the input of the VCO 13, an input signal C to VCO 13 when the output of the LPF 16 is connected to the input of the VCO 13.

Since the bandpass type delta sigma modulation section 15 is not designed so as to obtain desired output characteristics, the bandpass type delta sigma modulation section 15 has characteristics which cannot cover a low frequency side like the output signals A indicated by the long dashed double-short dashed lines in FIGS. 6A and 6B. Meanwhile, the characteristics caused by the feedback loop cannot cover a high frequency side like output signals D indicated by the long dashed short dashed lines in FIGS. 6A and 6B. There is a frequency region where the characteristics of the output signals A and D do not overlap with each other and which cannot be covered by the output signals A and D. Therefore, the signal power of the input signal C inputted to the VCO 13 has characteristics in which a low frequency side is attenuated as indicated by the heavy line in FIG. 6A.

The compensating filter 21 filters the inputted modulation signal such that the characteristics on the low frequency band side, which cannot be covered by the bandpass type delta sigma modulation section 15, are raised in advance in order to compensate the output characteristics of the bandpass type delta sigma modulation section 15 (the output signal E in FIG. 6B). The signal power of the input signal C inputted to the VCO 13 can obtain characteristics in which the low frequency band side is even as shown in FIG. 6B by the operation of the compensating filter 21 even when the bandpass type delta sigma modulation section 15 is not designed so as to obtain desired output characteristics.

As mentioned above, according to the frequency modulation circuit 2 of the second embodiment of the present invention, even when the bandpass type delta sigma modulation section 15 is not designed so as to obtain desired output characteristics, the compensating filter 21 compensates the output characteristics of the bandpass type delta sigma modulation section 15. Thus, the frequency modulation circuit 2 can output a frequency modulation signal the noise of which is reduced in the frequency band which requires low noise.

Third Embodiment

Figure 7:
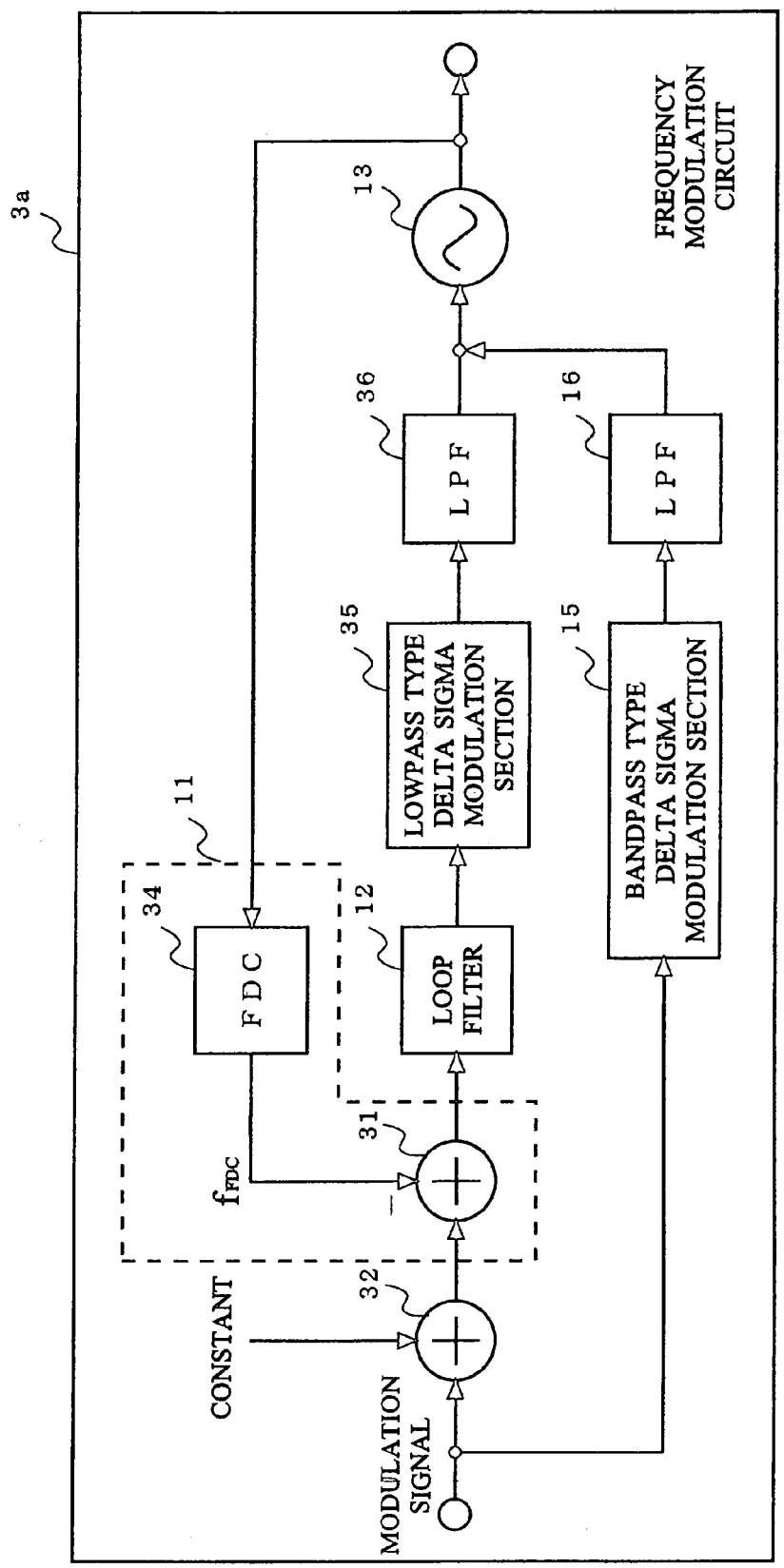
FIG. 7 is a diagram showing an exemplary configuration of a frequency modulation circuit 3a according to a third embodiment of the present invention.

FIG. 7 is a block diagram showing an exemplary configuration of a frequency modulation circuit 3a according to a third embodiment of the present invention. As shown in FIG. 7, the frequency modulation circuit 3a according to the third embodiment comprises a second arithmetic unit 32, a feedback comparison section 11, a loop filter 12, a lowpass type delta sigma modulation section 35, a VCO 13, a bandpass type delta sigma modulation section 15, an LPF 16 and an LPF 36. The feedback comparison section 11 includes a first arithmetic unit 31 and a frequency digital converter (FDC) 34. It is noted that the same components as those in the above-mentioned first embodiment are designated by the same reference numerals, and the description thereof will be omitted.

Figure 8:
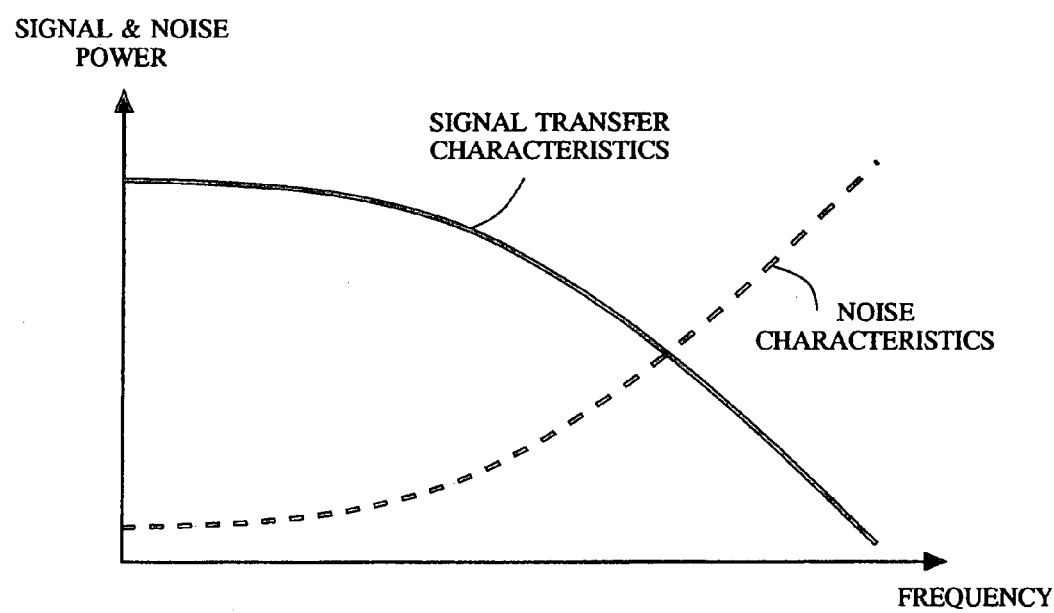
FIG. 8 illustrates characteristics of a lowpass type delta sigma modulation section 35.

A modulation signal (Δθ/Δt, θ is a phase modulation signal) is inputted to the second arithmetic unit 32 through an input terminal. The second arithmetic unit 32 adds or subtracts a constant to or from the inputted modulation signal to control the center frequency of the modulation signal. The lowpass type delta sigma modulation section 35 performs delta sigma modulation on the modulation signal outputted by the loop filter 12, and outputs to the VCO 13 the modulation signal on which the delta sigma modulation has been performed. The lowpass type delta sigma modulation section 35 has signal transfer characteristics of lowpass type, and reduces noise in the vicinity of a direct current component DC of the modulation signal by performing the delta sigma modulation on the modulation signal. FIG. 8 illustrates characteristics of the lowpass type delta sigma modulation section 35. The LPF 36 suppresses noise such as quantization noise generated with the processing by the lowpass type delta sigma modulation section 35.

The FDC 34 converts the frequency of the frequency modulation signal outputted by the VCO 13 into a digital value according to a predetermined manner, and outputs the converted digital value to the first arithmetic unit 31. The first arithmetic unit 31 adds or subtracts the digital value outputted by the FDC 34 to or from the modulation signal inputted through the second arithmetic unit 32, and outputs a resultant signal to the loop filter 12. In other words, the FDC 34, the first arithmetic unit 31, the loop filter 12, and the VCO 13 constitute a feedback loop which stabilizes the frequency of the frequency modulation signal outputted by the VCO 13.

As mentioned above, according to the frequency modulation circuit 3a of the third embodiment of the present invention, the center frequency of the frequency modulation signal outputted by the VCO 13 is changed by controlling the center frequency of the modulation signal by the second arithmetic unit 32. The provision of the lowpass type delta sigma modulation section 35 in the previous stage of the VCO 13 can more effectively reduce the noise in the vicinity of the direct current component DC of the modulation signal. Thus, the frequency modulation circuit 3a can output a frequency modulation signal the noise of which is reduced in the frequency band which requires low noise.

Figure 9:
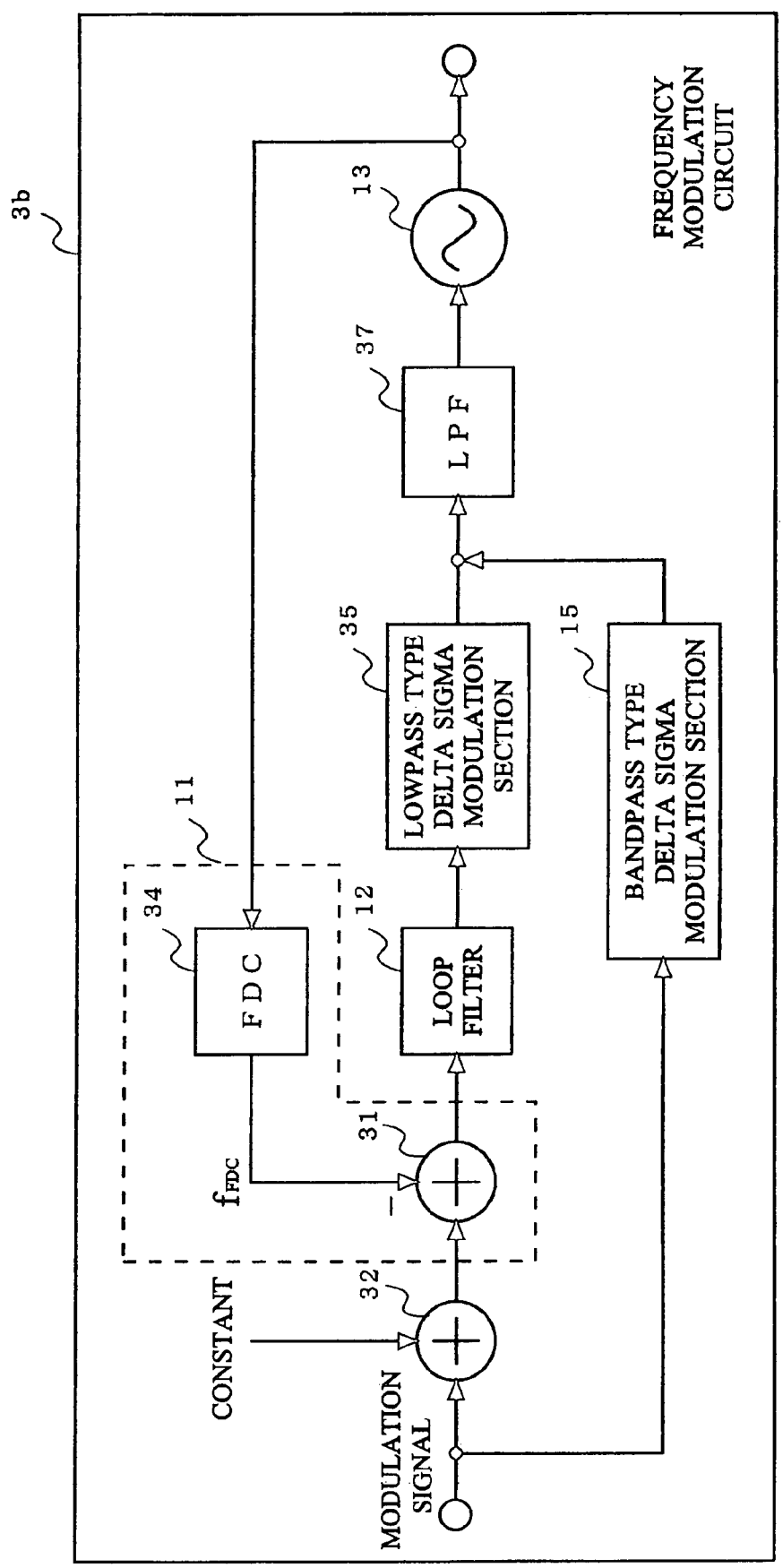
FIG. 9 is a diagram showing another exemplary configuration of a frequency modulation circuit 3b according to the third embodiment of the present invention.

It is noted that in the case where frequency characteristics required for the LPF 16 corresponds to or approximates that for the LPF 36, the LPF 16 and the LPF 36 may be integrated as an LPF 37 like the configuration of a frequency modulation circuit 3b as shown in FIG. 9. Sharing the LPF can reduce a circuit size.

Fourth Embodiment

Figure 10:
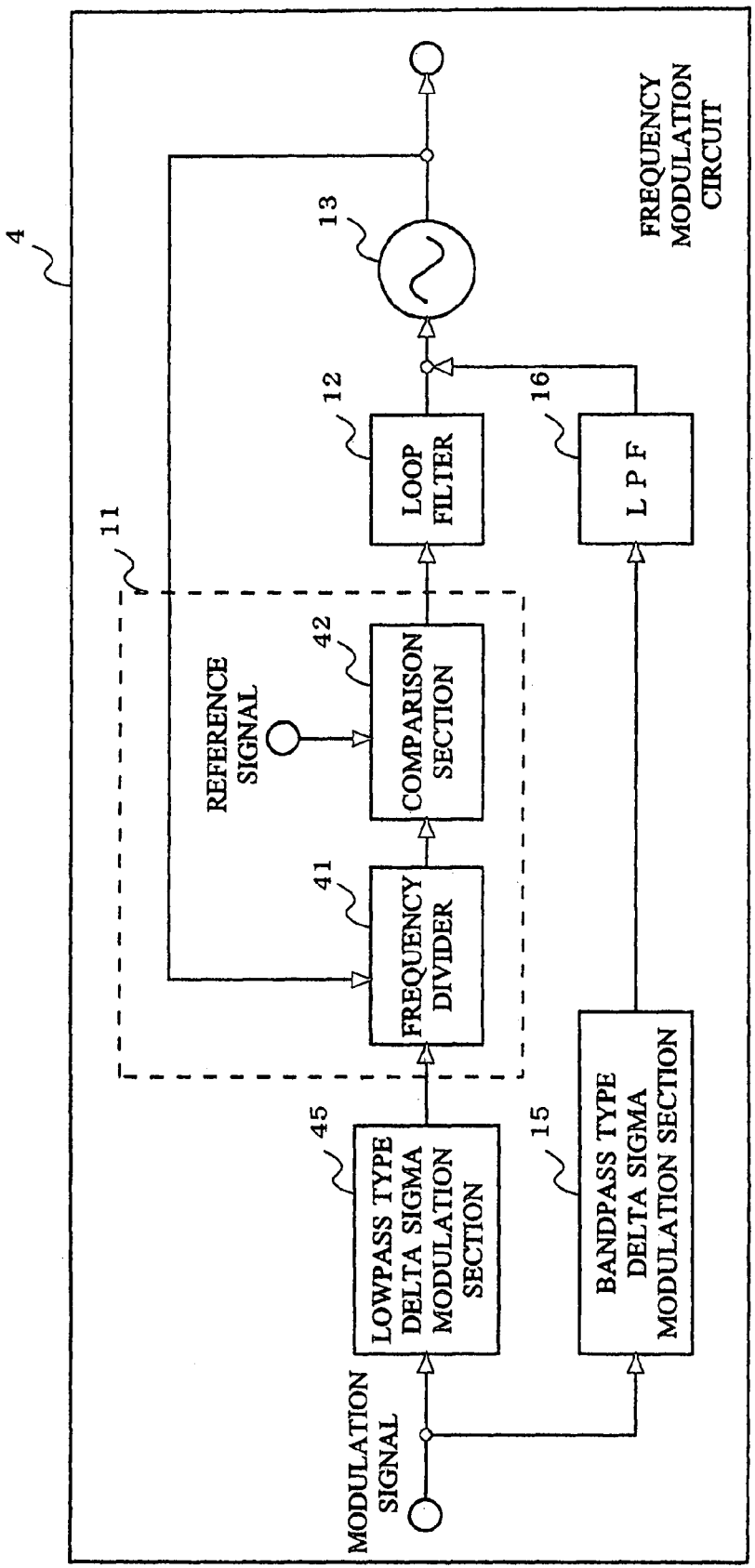
FIG. 10 is a diagram showing an exemplary configuration of a frequency modulation circuit 4 according to a fourth embodiment of the present invention.

FIG. 10 is a block diagram showing an exemplary configuration of a frequency modulation circuit 4 according to a fourth embodiment of the present invention. As shown in FIG. 10, the frequency modulation circuit 4 according to the fourth embodiment comprises a lowpass type delta sigma modulation section 45, a feedback comparison section 11, a loop filter 12, a VCO 13, a bandpass type delta sigma modulation section 15, and an LPF 16. The feedback comparison section 11 includes a frequency divider 41 and a comparison section 42. It is noted that the same components as those in the above-mentioned first embodiment are designated by the same reference numerals, and the description thereof will be omitted.

A modulation signal (Δθ/Δt, θ is a phase modulation signal) and a reference signal are inputted to the frequency modulation circuit 4 through two input terminals, respectively. The modulation signal is inputted to the lowpass type delta sigma modulation section 45 and the bandpass type delta sigma modulation section 15. The lowpass type delta sigma modulation section 45 performs delta sigma modulation with signal transfer characteristics of lowpass type (cf. FIG. 8) on the inputted modulation signal, and outputs to the frequency divider 41 the modulation signal on which the delta sigma modulation has been performed. The frequency divider 41 frequency-divides the frequency modulation signal outputted by the VCO 13 with the modulation signal outputted from the lowpass type delta sigma modulation section 45. The comparison section 42 compares the frequency of the inputted reference signal with the frequency of the frequency modulation signal inputted through the frequency divider 41, and controls the oscillatory frequency of the VCO 13 such that both of the signals are synchronized. In other words, the frequency divider 41, the comparison section 42, and the loop filter 12 constitute a feedback loop.

As mentioned above, according to the frequency modulation circuit 4 of the fourth embodiment of the present invention, the center frequency of the frequency modulation signal outputted by the VCO 13 can be changed by controlling the oscillatory frequency of the VCO 13 using the feedback loop. Thus, the frequency modulation circuit 4 can output a frequency modulation signal the noise of which is reduced in the frequency band which requires low noise.

The first to fourth embodiments have described the frequency modulation circuits 1 to 4 including the LPF 16 and/or the LPF 36. However, when quantization noise generated at the bandpass type delta sigma modulation section 15 and/or the lowpass type delta sigma modulation sections 35 and 45 are sufficiently reduced, or in the case of a system which has no problem even when noise is large in a frequency band-which is distant from the frequency band which requires low noise, the LPF 16 and/or the LPF 36 can be omitted.

Naturally, the compensating filter 21 mentioned in the above second embodiment can be added in the previous stage of the bandpass type delta sigma modulation section 15 in the frequency modulation circuits 3a, 3b, and 4 of the third and fourth embodiments.

Fifth Embodiment

Figure 11:
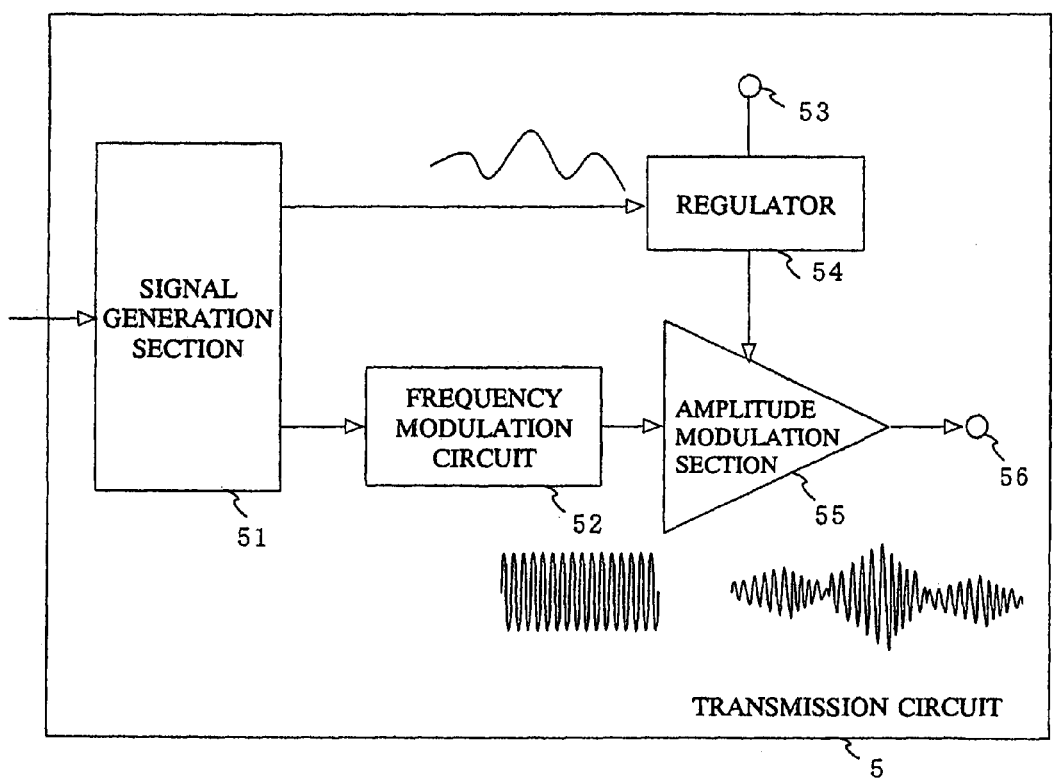
FIG. 11 is a diagram showing an exemplary configuration of a transmission circuit 5 according to a fifth embodiment of the present invention.

FIG. 11 is a block diagram showing an exemplary configuration of a transmission circuit 5 according to a fifth embodiment of the present invention. As shown in FIG. 11, the transmission circuit 5 according to the fifth embodiment comprises a signal generation section 51, a frequency modulation circuit 52, a regulator 54, and an amplitude modulation section 55. Any one of the frequency modulation circuits 1 to 4 mentioned in the first to fourth embodiments is used as the frequency modulation circuit 52.

The signal generation section 51 generates an amplitude signal and a phase signal from an input signal. The amplitude signal is inputted to the regulator 54. Direct-current voltage is supplied from a power supply terminal 53 to the regulator 54. The regulator 54 supplies to the amplitude modulation section 55 a signal which is controlled according to the inputted amplitude signal. The phase signal is inputted to the frequency modulation circuit 52. The frequency modulation circuit 52 frequency-modulates the inputted phase signal, and outputs a frequency modulation signal. The frequency modulation signal is inputted to the amplitude modulation section 55. The amplitude modulation section 55 amplitude-modulates the frequency modulation signal with the signal supplied from the regulator 54, and outputs a resultant signal as a frequency-modulated and amplitude-modulated modulation signal. The modulation signal is outputted as a transmission signal through an output terminal 56. Such transmission circuit 5 is referred to as a polar modulation circuit.

Such transmission circuit 5 operates with low distortion and high efficiency and can operate with low noise since the frequency modulation circuit 52 outputs a frequency modulation signal the noise of which is reduced in the frequency band which requires low noise. Thus, when installed in a communication apparatus which performs transmission and reception concurrently, the transmission circuit 5 reduces noise present in a band which overlaps with a receiving band of the communication apparatus, thereby preventing noise generated at the frequency modulation circuit 52 from adversely affecting the receiving quality of the communication apparatus.

Sixth Embodiment

Figure 12:
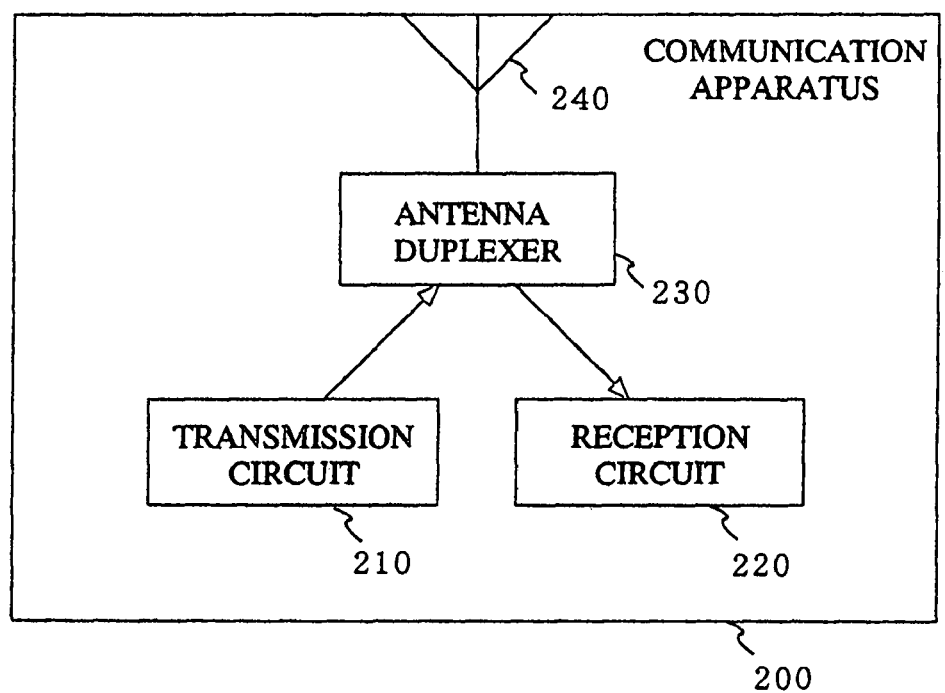
FIG. 12 is a diagram showing an exemplary configuration of a communication apparatus 200 according to a sixth embodiment of the present invention.

FIG. 12 is a block diagram showing an exemplary configuration of a communication apparatus 200 according to a sixth embodiment of the present invention. Referring to FIG. 12, the communication apparatus 200 according to the sixth comprises a transmission circuit 210, a reception circuit 220, an antenna duplexer 230, and an antenna 240. The transmission circuit 5 mentioned in the above fifth embodiment is used as the transmission circuit 210.

The antenna duplexer 230 transmits to the antenna 240 a transmission signal outputted from the transmission circuit 210, and prevents the transmission signal from leaking to the reception circuit 220. The antenna duplexer 230 transmits to the reception circuit 220 a reception signal inputted from the antenna 240, and prevents the reception signal from leaking to the transmission circuit 210. Accordingly, the transmission signal is outputted from the transmission circuit 210, and released from the antenna 240 to the exterior space via the antenna duplexer 230. The reception signal is received by the antenna 240 and then received by the reception circuit 220 via the antenna duplexer 230.

The communication apparatus 200 according to the sixth embodiment uses the transmission circuit 5 according to the fifth embodiment, thereby ensuring the linearity of the transmission signal and achieving low distortion of a radio device. Since there is no branch, such as a directional coupler, on the output of the transmission circuit 210, loss from the transmission circuit 210 to antenna 240 can be reduced. Thus, power consumption is reduced at the time of transmission, with the result that the communication apparatus 200 is capable of operating as a radio communication device for a long period of time. Further, the transmission circuit 210 of the communication apparatus 200 reduces noise present in a band which overlaps with a receiving band of the reception circuit 220, thereby preventing noise generated at the transmission circuit 210 from adversely affecting the receiving quality of the reception circuit 220. It is noted that the communication apparatus 200 may comprise only the transmission circuit 210 and the antenna 240.

While the invention has been described in detail, the foregoing description is in all aspects illustrative and not restrictive. It is understood that numerous other modifications and variations can be devised without departing from the scope of the invention.

What is claimed is:

1. A frequency modulation circuit for frequency modulating and outputting an output frequency modulation signal, the frequency modulation circuit comprising:
   a bandpass type delta sigma modulation section operable to receive an input modulation signal and perform delta sigma modulation on the received input modulation signal, such that quantization noise is suppressed in a frequency band which requires low noise, and output a first resultant signal;
   a feedback comparison section operable to receive the same input modulation signal, compare the output frequency modulation signal with the received input modulation signal, control a frequency of the received input modulation signal according to a result of the comparison, and output a frequency-controlled modulation signal;

a loop filter operable to suppress a high-frequency component of the frequency-controlled modulation signal and output a second resultant signal; and a voltage controlled oscillator operable to perform frequency-modulation by controlling an oscillatory frequency according to a combination of the second resultant signal outputted from the loop filter and the first resultant signal outputted from the bandpass type delta sigma modulation section, and output the output frequency modulation signal.

2. The frequency modulation circuit according to claim 1, further comprising a compensating filter operable to filter the input modulation signal and output the input modulation signal on which filtering by the compensating filter has been performed to the bandpass type delta sigma modulation section to compensate for output characteristics of the bandpass type delta sigma modulation section.

3. The frequency modulation circuit according to claim 1, wherein
the feedback comparison section includes:
a frequency digital converter operable to convert a frequency of the output frequency modulation signal outputted by the voltage controlled oscillator into a digital value based on a predetermined manner; and
an arithmetic section operable to add or subtract the digital value converted by the frequency digital converter to or from the input modulation signal.

4. The frequency modulation circuit according to claim 2, wherein
the feedback comparison section includes:
a frequency digital converter operable to convert a frequency of the output frequency modulation signal outputted by the voltage controlled oscillator into a digital value based on a predetermined manner; and
an arithmetic section operable to add or subtract the digital value converted by the frequency digital converter to or from the input modulation signal.

5. The frequency modulation circuit according to claim 3, further comprising a lowpass type delta sigma modulation section operable to perform delta sigma modulation with signal transfer characteristics of lowpass type on the second resultant signal outputted from the loop filter, and output to the voltage controlled oscillator the second resultant signal on which the delta sigma modulation has been performed.

6. The frequency modulation circuit according to claim 4, further comprising a lowpass type delta sigma modulation section operable to perform delta sigma modulation with signal transfer characteristics of lowpass type on the second resultant signal outputted from the loop filter, and output to the voltage controlled oscillator the second resultant signal on which the delta sigma modulation has been performed.

7. The frequency modulation circuit according to claim 5, further comprising a second arithmetic section operable to control a center frequency of the input modulation signal by adding or subtracting a constant to or from the input modulation signal, and output to the arithmetic section the controlled input modulation signal.

8. The frequency modulation circuit according to claim 6, further comprising a second arithmetic section operable to control a signal a center frequency of the input modulation signal by adding or subtracting a constant to or from the input modulation signal, and output to the arithmetic section the controlled input modulation signal.

9. The frequency modulation circuit according to claim 1, further comprising a lowpass type delta sigma modulation section operable to perform delta sigma modulation with signal transfer characteristics of lowpass type on the input modulation signal, and output to the feedback comparison section the input modulation signal on which the delta sigma modulation has been performed, wherein
the feedback comparison section includes:
a frequency divider operable to frequency-divide the output frequency modulation signal outputted by the voltage controlled oscillator with the input modulation signal on which the delta sigma modulation has been performed by the lowpass type delta sigma modulation section; and
a comparison section operable to compare a predetermined reference signal with the frequency-divided output frequency modulation signal from the frequency divider, and control the oscillatory frequency of the voltage controlled oscillator such that the frequency-divided output frequency modulation signal and the predetermined reference signal are synchronized.

10. The frequency modulation circuit according to claim 2, further comprising a lowpass type delta sigma modulation section operable to perform delta sigma modulation with signal transfer characteristics of lowpass type on the input modulation signal, and output to the feedback comparison section the input modulation signal on which the delta sigma modulation has been performed, wherein
the feedback comparison section includes:
a frequency divider operable to frequency-divide the output frequency modulation signal outputted by the voltage controlled oscillator with the input modulation signal on which the delta sigma modulation has been performed by the lowpass type delta sigma modulation section; and
a comparison section operable to compare a predetermined reference signal with the frequency-divided output frequency modulation signal from the frequency divider, and control the oscillatory frequency of the voltage controlled oscillator such that the frequency-divided output frequency modulation signal and the predetermined reference signal are synchronized.

* * * * *